United States Patent [19]
Kyle

[11] Patent Number: 5,200,717
[45] Date of Patent: Apr. 6, 1993

[54] ACTIVE ELECTRICAL CIRCUITRY INTERCONNECTED AND SHIELDED BY ELASTOMER MEANS

[75] Inventor: Michael L. Kyle, Portland, Oreg.

[73] Assignee: Tektronix, Inc., Wilsonville, Oreg.

[21] Appl. No.: 683,643

[22] Filed: Apr. 11, 1991

[51] Int. Cl.$^5$ .............................................. H01P 5/00
[52] U.S. Cl. ........................... 333/24 R; 333/81 R; 333/260
[58] Field of Search ............... 333/81 R, 81 A, 246, 333/260, 24 R

[56] References Cited

U.S. PATENT DOCUMENTS

| | | | |
|---|---|---|---|
| 3,795,884 | 3/1974 | Kotaka | 333/246 X |
| 4,330,765 | 5/1982 | Patukonis | 333/81 A |
| 4,495,458 | 1/1985 | Murphy | 324/602 |
| 4,525,688 | 6/1985 | Murphy et al. | 333/81 R |
| 4,795,960 | 1/1989 | Malcolm | 333/81 A X |

FOREIGN PATENT DOCUMENTS

| | | | |
|---|---|---|---|
| 123201 | 7/1983 | Japan | 333/246 |
| 208304 | 8/1988 | Japan | 333/260 |
| 2155251 | 9/1985 | United Kingdom | |

Primary Examiner—Paul M. Dzierzynski
Assistant Examiner—Benny Lee
Attorney, Agent, or Firm—Francis I. Gray; Boulden G. Griffith

[57] ABSTRACT

An attenuator assembly (38) employs circuitry formed on an attenuator substrate (44) having short voltage divider path lengths that allow the use of low-cost divider selecting relays (58, 60, and 62) while maintaining low VSWR and aberration levels through the attenuator. An interconnect circuit board (80) provides electrical power, control signals, a ground plane shield (108), and probe coding contacts (32) for connection to the attenuator substrate. The circuits on the attenuator substrate are laser-trimmed to obtain predetermined electrical characteristics prior to assembly in a completed attenuator assembly. The attenuator substrate rests on a recess (128) formed in top margin (127) of a cavity (120) formed within a housing (42). A conductive elastomer (102) compressed between the attenuator substrate and the interconnect board electrically connects the interconnect board circuits with the attenuator circuit and forms a conductive shield path (110) between the housing and the ground plane shield of the interconnect board. Multiple attenuator circuits, each in a separate cavity of the housing, share a single interconnect board and conductive elastomer material, thereby resulting in a simple, well shielded, low-cost, attenuator assembly.

10 Claims, 3 Drawing Sheets

ACTIVE ELECTRICAL CIRCUITRY INTERCONNECTED AND SHIELDED BY ELASTOMER MEANS

TECHNICAL FIELD

This invention relates generally to apparatus for interconnecting and isolating active electrical circuitry and, in particular, to the structure, assembly, and electrical interconnection of a wide bandwidth, high impedance, attenuator having high signal fidelity for use in input signal conditioning applications of electrical measurement systems such as oscilloscopes.

BACKGROUND OF THE INVENTION

An attenuator requires a high input impedance to minimize loading of the input signal while providing typical switchable signal attenuation ratios of 1:1 (1×), 10:1 (10×), and 100:1 (100×). The electrical characteristics of such an attenuator must be stable and accurate when subjected to input signals having bandwidths ranging from DC to 1 GHz and voltages ranging up to 500 peak volts. The attenuator must also have a low voltage-standing-wave-ratio (VSWR) and impart few aberrations to the input signal as it passes through the attenuator. Moreover, the entire assembly must be well shielded to prevent the coupling of undesired external signals into the attenuator circuits.

U.S. Pat. No. 4,495,458 of Murphy et al., assigned to the assignee of the present patent application, describes attenuator circuitry meeting many of the above requirements. FIG. 1 is a simplified schematic diagram of a prior art attenuator similar to that described by Murphy et al. The attenuator includes divider circuits 10 and 12 that are selectively connected in electrical series by divider relays 14, 16, 18, and 20. Input signals applied to an input 22 are coupled to divider circuits 10 and 12 through a coupling relay 24 that selects AC or DC coupling. A termination relay 26 connects a 50 ohm termination resistor 28 to the input signal when desired. A buffer amplifier 30 provides the necessary high-input impedance for minimal loading of the input signal and has a low-output impedance necessary for driving measurement circuits. FIG. 1 also shows a set of probe coding contacts 32 that surround input 22. Such contacts are typically used to detect particular characteristics of measurement probes such as attenuation ratio and to provide power and offset voltage signals to probes having active electrical circuits.

The manufacture of an attenuator of the type shown in FIG. 1 is costly and typically requires numerous miniature components mounted on subassemblies, thereby requiring tedious assembly with numerous interconnections and fasteners. Post-assembly calibration of divider stages is necessary and is subject to electrical interaction between stages. Such an attenuator assembly is especially disadvantageous for use in oscilloscopes because they typically require four attenuators, which are typically manufactured one-at-a-time.

U.S. Pat. No. 5,032,801 for a "High Performance Attenuator Configuration" to Woo et al., assigned to the assignee of the present patent application, describes an attenuator having multiple parallel voltage divider paths that are switched by a combination of relays and active circuits. The attenuator topology of Woo et al. requires fewer, less costly relays and has shorter overall circuit path lengths that result in lower VSWR and aberrations than those present in conventional attenuators. The parallel path topology also eliminates electrical interaction between dividers during calibration. However, the assembly, interconnection, and shielding, of the attenuator is not addressed in the application.

UK Pat. Application No. GB 2 155 251A describes the use of a conductive elastomer for the interconnection of integrated circuits to substrates, ribbon cables to circuit boards, and other typical interconnection schemes. A useful property of conductive elastomers is that they contain a plurality of minute conductors that conduct linearly through the material without conducting laterally within the material. Hewlett-Packard Corporation, Palo Alto, Calif., manufactures the 54500 series of oscilloscopes that are known to use conductive elastomers for ground returns in attenuator circuits. However, the Hewlett-Packard attenuators are assembled one-at-a-time, and use cascade path topology requiring expensive relays.

SUMMARY OF THE INVENTION

An object of this invention is, therefore, to provide a high-performance attenuator having reduced manufacturing costs.

Another object of this invention is to provide a low-cost method of assembling multiple attenuators in a single, quick, simple, and repeatable series of steps.

A further object of this invention is to incorporate a high degree of mechanical repeatability and accuracy into the assembly of attenuators, thereby eliminating the need for post-assembly calibration.

Yet another object of this invention is to minimize the number of electrical interconnect parts required to assemble an attenuator.

Still another object of this invention is to provide an attenuator having low VSWR and low aberrations, and a high degree of isolation from undesired external signals.

This invention employs parallel path attenuator circuit topology by means of surface-mount devices and thick-film hybrid circuit technology fabricated on an alumina substrate. Short voltage divider path lengths allow the use of low-cost relays of the type used in telephone switching systems, while maintaining low VSWR and low aberration levels. A separate interconnect circuit board provides electrical power, control signals, a ground plane shield, and probe coding interconnections for the attenuator circuit. The voltage dividers on the hybrid substrate are laser-trimmed to obtain predetermined electrical characteristics prior to assembly in a finished attenuator. The attenuator circuit rests in a recess positioned near the top, and inside a conductive cavity formed within a housing.

A conductive elastomer compressed between the attenuator circuit substrate and the interconnect board electrically connects the interconnect board circuits with the attenuator circuit. The conductive elastomer also forms a conductive shield path between the housing and the ground plane shield of the interconnect circuit board, thereby surrounding sensitive signal paths and attenuator circuits. Multiple attenuator circuits, each in a separate cavity of the housing, share a single interconnect board and conductive elastomer material, thereby resulting in a simple, low-cost, attenuator assembly.

Additional objects and advantages of this invention will be apparent from the following detailed description

DETAILED DESCRIPTION OF THE PREFERRED EMBODIMENT

Figure 2:
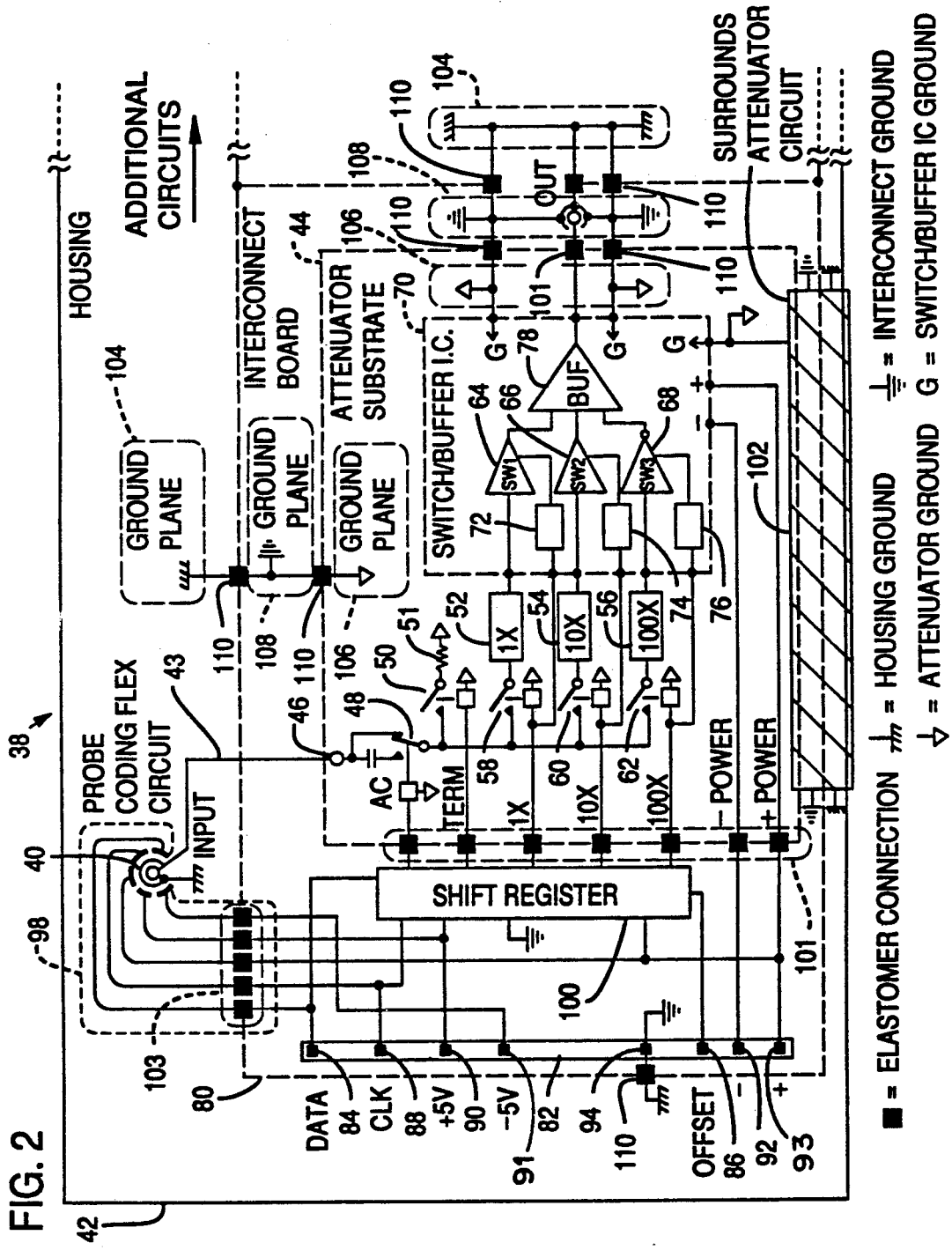
FIG. 2 is a simplified schematic diagram of the attenuator subassemblies interconnected according to this invention.

Referring to FIG. 2, an understanding of the interrelationships among various mechanical subassemblies of a preferred multiple attenuator assembly 38 of this invention may be enhanced by the following description of the overall electrical operation of the invention.

An input signal applied to an input connector 40 that is installed in a housing 42 is connected by a wire 43 to an attenuator substrate 44 at an eyelet hole 46. A coupling relay 48, preferably a model TN2E-12V-H111 made by Aromat, Inc., selects either AC or DC coupling for the input signal path. A termination relay 50, preferably a model DS1E-M-DC12V-H166 also made by Aromat, Inc., selectively connects a 50 ohm termination resistor 51 to the signal path. Attenuator substrate 44 has a 1× voltage divider 52, a 10× voltage divider 54, and a 100× voltage divider 56 coupled to the input signal path via respective divider relays 58, 60, and 62 of the Aromat type. Each of the voltage dividers 52, 54, and 56 is a passive network formed of resistors and capacitors, as is known to skilled persons in the art. Voltage dividers 52, 54, and 56 terminate in respective FET switch amplifiers 64, 66, and 68 implemented as a part of a switch/buffer integrated circuit 70, which is surface mounted to attenuator substrate 44. The outputs of FET switch amplifiers 64, 66, and 68 are selectively coupled via respective switch driver circuits 72, 74, and 76 to a buffer amplifier 78. Voltage dividers 52, 54, and 56 comprise resistors that are laser-trimmed to accuracy specifications prior to final assembly of multiple attenuator assembly 38.

A planar interconnect board 80 mounted to housing 42 has a connector 82 with multiple contacts. Interconnect board 80 includes an attenuator data shift register 100 for storing the data used to control the relays and switches on attenuator substrate 44. Conventional serial methods are used for transferring external data into and out of the shift register 100, thereby reducing the number of signal contacts required in a ribbon cable coupled to connector 82. Connector 82 provides a serial data input 84, a clock (CLK) input 88, a +5V input 90, a −5V input 91, an OFFSET input 86, and plus (+) and minus (−) POWER inputs 92 and 93 from an instrument that the attenuator is connected to. Connector 82 also provides a pad 94 that connects the housing ground to the interconnect ground. The serial data loads shift register 100 while OFFSET is active. The outputs of shift register 100, AC, TERM, 1×, 10× and 100× control respective relays 48, 50, 58, 60, and 62.

A set of electrical signal paths 101 is formed by a conductive elastomer material 102 that is compressed between attenuator substrate 44 and interconnect board 80. Conductive elastomer 102 also forms a set of connection paths 103 between interconnect board 80 and probe coding flex circuit 98. The compressive force of conductive elastomer 102 urges attenuator substrate 44 tightly against housing 42, causing electrical contact between a ground plane 104 of housing 42 and a ground plane 106 of attenuator substrate 44. Conductive elastomer 102 overlaps attenuator substrate 44 and housing 42, further forming of a set of conductive shield paths 110 among housing ground plane 104, attenuator ground plane 106, and an interconnect board ground plane 108. Conductive shield paths 110 surround the periphery of attenuator substrate 44 thereby forming an electrostatic shield that encircles electrical signal paths 101 and the circuits on attenuator substrate 44.

Figure 3:
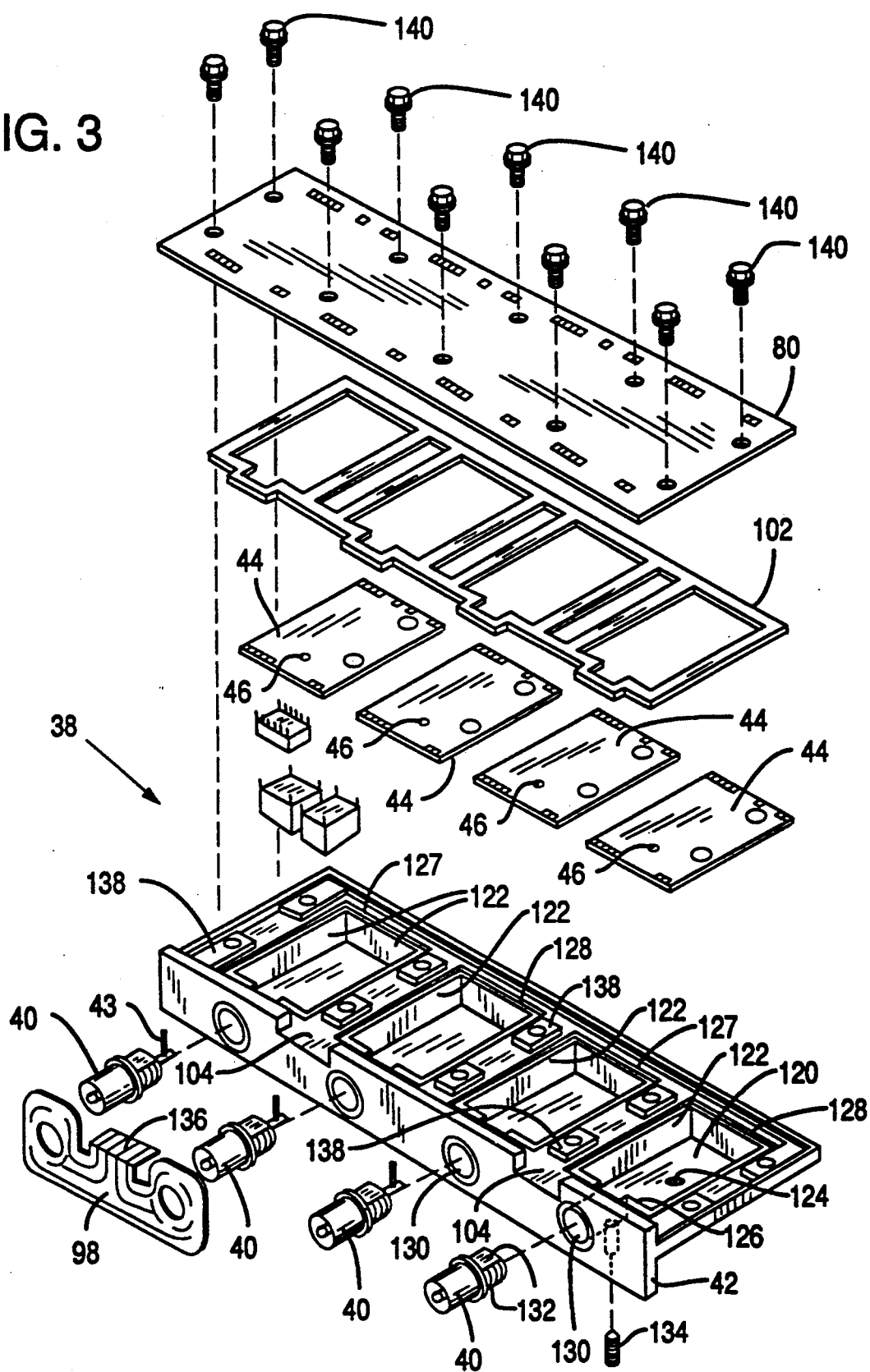
FIG. 3 is an exploded isometric view of the various subassemblies comprising an assembly of multiple attenuators.

FIG. 3 is an exploded isometric view showing the mechanical interrelationships of the various subassemblies comprising multiple attenuator assembly 38. Housing 42, which is preferably an aluminum die casting, includes a set of four adjacent cavities 120 each having a set of side walls 122, a floor 124, and an indented front wall 126. Each cavity 120 has a top margin 127 with an approximately 1.0 mm deep recess 128 upon which attenuator substrate 44 rests. Electrically active circuitry can be carried on both major surfaces of attenuator substrate 44 with major components facing floor 124 of cavity 120. In the preferred embodiment, connections between the two major surfaces of attenuator substrate 44 are made by conventional plated thru-hole connections. Attenuator substrate 44 is preferably of the same order of thickness as the depth of recess 128 in top margin 127.

Indented front wall 126 of each cavity 120 is drilled and tapped with a hole 130 to accept input connector 40 of the BNC type having a threaded body that includes a pair of parallel flats 132. The body of each connector 40 occupies the space provided by the indentation in each indented front wall 126 with one of flats 132 flush with the top of the indentation. This positions connectors 40 high in cavities 120 to allow close spacing of connector 40 and attenuator substrate 44.

Preferably the threads of each connector 40 are coated with TRA-BOND BA-2114 thread compound, turned are coated with TRA-BOND BA fully into hole 130 and then backed out until a flat 132 on each connector 40 is aligned parallel to top margin 127 of each respective cavity 120. All four connectors 40 are positioned by a jig (not shown) and are then secured by set screws 134 each of which engages one of the flats 132 of each connector 40. The jig is removed and the thread compound allowed to set, thereby securely fastening and positioning input connectors 40 to housing 42.

Interconnection of wire 43 is accomplished by hand-soldering wire 43 to connector 40. Wire 43 is guided through eyelet hole 46 while attenuator substrate 44 is positioned on the recess 128 in top margin 127 of housing 42. Wire 43 and eyelet hole 46 are then hand-soldered.

A probe coding flex circuit 98 has single-sided probe coding circuits dedicated to two input connectors 40. Probe coding flex circuit 98 is placed over a pair of adjacent input connectors 40 and is brought into flush contact with housing 42, with the circuitry bearing side of circuit 98 facing away from housing 42. Probe coding flex circuit 98 includes a contact strip 136 that is folded over to be flush with housing ground plane 104 with the contact side of strip 136 facing away from housing ground plane 104. A second probe coding flex circuit 98 is likewise placed over the adjacent pair of input connectors 40. The flush contact of flex circuits 98 with housing 42 forms a capacitance useful for decoupling undesired electrical signals from contact strip 136.

Housing 42 includes a set of approximately 2.0 mm high spacers 138 around which conductive elastomer material 102 is placed. Conductive elastomer material 102 ranges in thickness from 2.4 mm to 2.8 mm and is cut to a shape that allows an approximately 6.5 mm width of conductive elastomer material 102 to overlap housing 42 and attenuator substrates 44 in the regions adjacent to the recesses 128 in top margins 127. Conductive elastomer material 102 also overlaps probe coding contact strips 136 but does not contact a majority of the major surface of attenuator substrate 44 that faces away from cavity 120.

Interconnect board 80 is mounted against spacers 138 by a set of ten mounting capscrews 140. Interconnect board 80 is preferably a 3.2 mm thick double-sided circuit board fabricated according to conventional methods from G-10 copper-clad fiberglass material. Conductive elastomer material 102 is compressed to a thickness of approximately 2.0 mm by the tightening of capscrews 140. To assure reliable electrical connection, points on interconnect board 80 in electrical contact with conductive elastomer material 102 are preferably selective gold plated and hot air leveled according to processes well known in the art. In actual practice, conductive elastomer material 102 forms over two hundred (200) electrical connections in a single assembly step.

Two alternative types of conductive elastomer material 102 satisfy the requirements of this invention. A preferred material is manufactured by Cinch, Inc., Elk Grove Village, Ill., under the trade name CIN--APSE, which uses a 2.0 mm thick plastic base material that is cut to a specified shape and then filled with gold-plated 2.8 mm long tungsten wire bundles at the predetermined connection points. The wire bundles are compressible and resemble tiny "scouring pads." CIN--APSE material has the disadvantage that it is limited in size and presently requires two identical pieces to interconnect four attenuator substrate assemblies as shown in FIG. 3.

An acceptable alternative conductive elastomer material 102 is manufactured by Chomerics, Inc., Woburn, Mass., under the trade name Polasheet. Polasheet is a silicon rubber material impregnated with a myriad of electrically conductive wires to form a "wire mat." For best results, a 2.4 mm thick stock material is gold plated to improve the conductivity of the wire ends exposed at the planar surfaces of the wire mat. A steel rule die is used to cut the wire mat to predetermined dimensions. Stray wires at the cut edges of the mat should be removed to prevent extraneous connections. Other materials substantially equivalent to those described above would be obvious substitutes.

Figure 1:
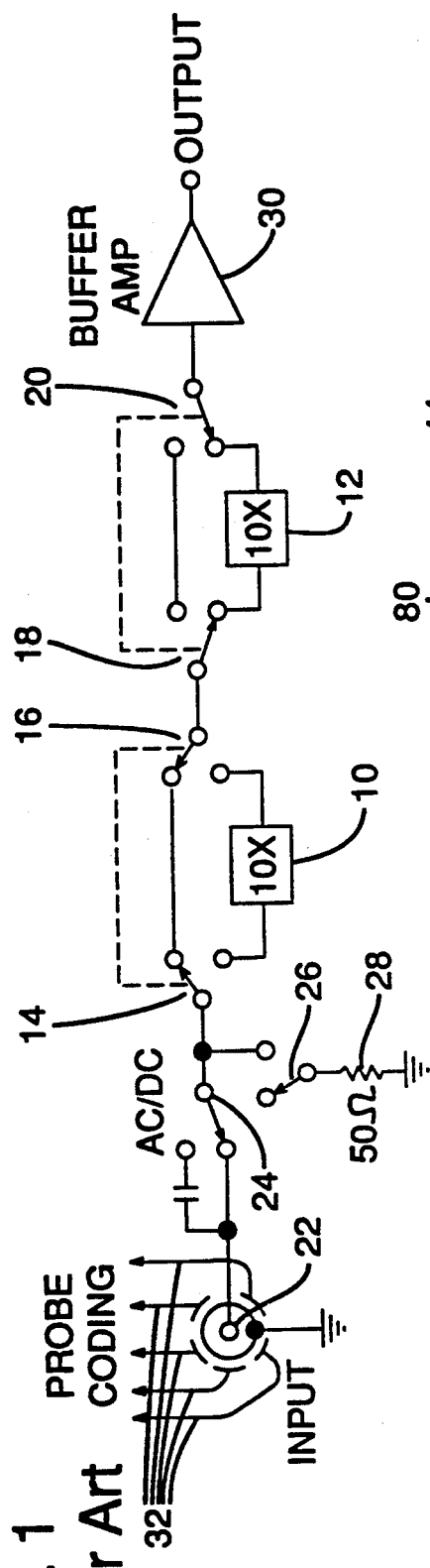
FIG. 1 is a simplified schematic diagram of a prior art attenuator circuit.
Figure 4:
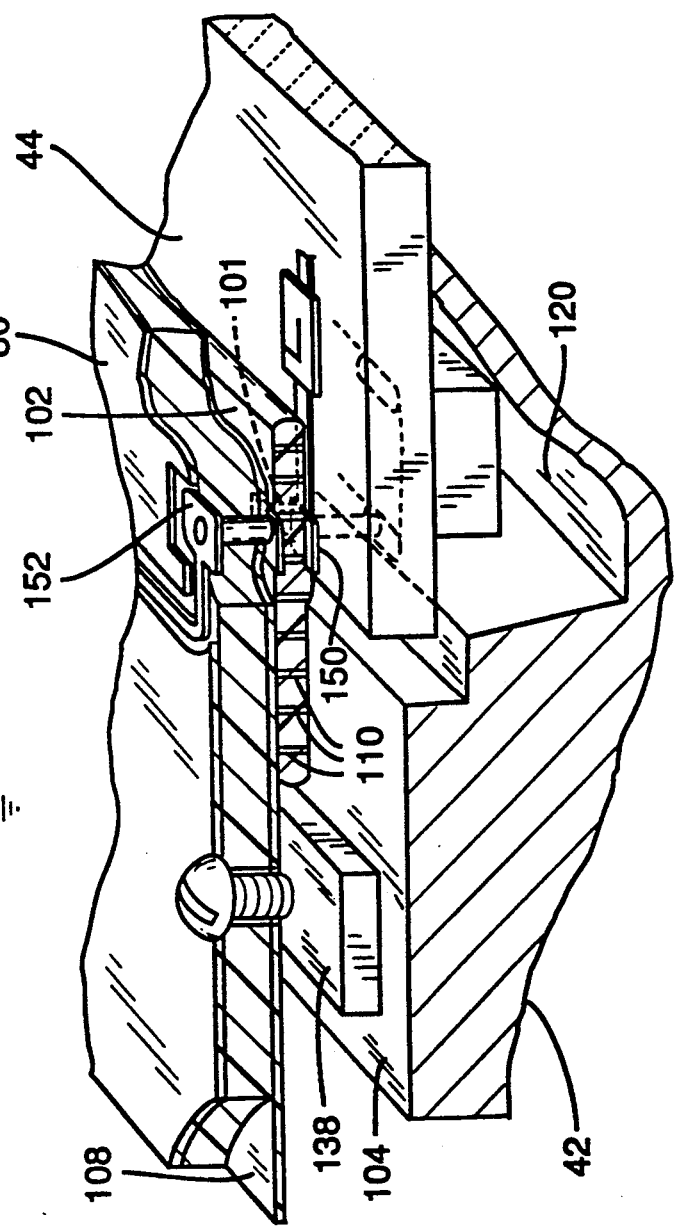
FIG. 4 is a fragmentary cross-sectional view showing the positional relationships of the housing, attenuator substrate, interconnect board, and conductive elastomer material with portions cut away to show different depthwise views of the typical signal and shielding conductor paths formed by the conductive elastomer.

FIG. 4 shows the positional relationships of housing 42, attenuator substrate 44, spacer 138, interconnect board 80, and conductive elastomer material 102. Portions of the view are cut away to show different depthwise views of a typical electrical signal path 101 and a typical conductive shield path 110 formed in conductive elastomer material 102. Conductive shield paths 110 are formed between housing ground plane 104 and interconnect board ground plane 108 and act together with cavity 120 to form an electrostatic shield that substantially surrounds attenuator substrate 44. Electrical signal path 101 interconnects an attenuator signal contact 150 and an interconnect board contact 152. Both contacts electrically connect through to their opposite major surfaces by conventional thru-hole plated means.

The positional relationships represented in FIG. 4 are very stable and can be accurately set. Line widths on attenuator substrate 44 are accurately spaced from interconnect board ground plane 108 and can therefore be designed as constant impedance transmission lines having very low VSWR. Parasitic reactances among various structures in the present invention have been found to be sufficiently stable and predictable to eliminate the need for post-assembly calibration of attenuators assembled in accordance with this invention. This invention exceeds projected performance requirements for an oscilloscope attenuator at a lower manufacturing cost than that of any previous attenuator known to applicant.

It will be obvious to those having skill in the art that many changes may be made to the details of the above-described embodiments of this invention without departing from the underlying principles thereof. For example, it will be appreciated that this invention is also applicable to circuit fabrication and assembly applications other than those found in oscilloscopes. The scope of the present invention should be determined, therefore, only by the following claims.

I claim:

1. An apparatus for interconnecting and shielding active electrical circuitry, comprising:
    a housing including an electrically conductive surface having an opening that defines at least one cavity positioned within the housing, the cavity having floor and wall with top margins adapted to support a first substrate, the first substrate carrying active electrical circuitry on a major surface thereof, the major surface facing the floor of the cavity;
    spacer means positioned on the electrically conductive surface of the housing for separating an interconnect circuit from the electrically conductive surface; and
    an electrically conductive elastomer material positioned under compression between the first substrate and the interconnect circuit around a periphery of the opening, the interconnect circuit including a second substrate having a plurality of signal conductors and a shield conductor, the elastomer providing electrically conductive paths between the active electrical circuitry on the first substrate and the signal conductors on the interconnect circuit and the elastomer further functioning as a shield that substantially surrounds the signal conductors and the active electrical circuitry.

2. The apparatus of claim 1 in which the top margins of the walls include recesses that support the first substrate.

3. The apparatus of claim 1 in which the active electrical circuits include electrical signal attenuator circuitry.

4. The apparatus of claim 1 wherein the at least one cavity comprises plural cavities within the housing, adjacent ones of the plural cavities being separated by a divider wall structure that defines walls of the adjacent cavities.

5. The apparatus of claim 4 in which the spacer means comprises plural members positioned at locations adjacent peripheries of the cavities.

6. The apparatus of claim 1 in which the spacer means is comprising an integral portion of the housing.

7. The apparatus of claim 1 in which the housing is the result of a die casting process.

8. The apparatus of claim 1 in which the first substrate is substantially planar and the active electrical circuitry includes a hybrid microcircuit with active electrical circuits comprising at least a network of laser-trimmed planar film resistors.

9. The apparatus of claim 1 in which the electrically conductive elastomer material includes an electrically non-conductive plastic base material in which compressible conductors are imbedded at predetermined locations.

10. The apparatus of claim 1 in which the electrically conductive elastomer material includes a compressible wire mat material.

* * * * *